United States Patent
Son et al.

(10) Patent No.: US 12,536,961 B2
(45) Date of Patent: Jan. 27, 2026

(54) PIXEL AND DISPLAY DEVICE INCLUDING THE SAME

(71) Applicant: Samsung Display Co., Ltd., Yongin-Si (KR)

(72) Inventors: Sung Min Son, Yongin-si (KR); Jae Jin Song, Yongin-si (KR); Soo Jo Ock, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/915,465

(22) Filed: Oct. 15, 2024

(65) Prior Publication Data

US 2025/0232724 A1    Jul. 17, 2025

(30) Foreign Application Priority Data

Jan. 16, 2024    (KR) .......................... 10-2024-0006916

(51) Int. Cl.
     *G09G 3/3233*    (2016.01)
     *G09G 3/32*        (2016.01)

(52) U.S. Cl.
     CPC ............ *G09G 3/3233* (2013.01); *G09G 3/32* (2013.01); *G09G 2300/0465* (2013.01); *G09G 2300/0819* (2013.01); *G09G 2300/0852* (2013.01); *G09G 2310/08* (2013.01); *G09G 2320/0261* (2013.01); *G09G 2340/0435* (2013.01)

(58) Field of Classification Search
None
See application file for complete search history.

(56) References Cited

U.S. PATENT DOCUMENTS

| | | |
|---|---|---|
| 9,576,532 B2 | 2/2017 | Lee |
| 10,861,393 B2 | 12/2020 | Kim et al. |
| 2024/0249682 A1* | 7/2024 | Yoon ..................... G09G 3/3266 |

FOREIGN PATENT DOCUMENTS

| | | |
|---|---|---|
| CN | 114023256 B | 6/2023 |
| KR | 10-2190161 B1 | 12/2020 |
| KR | 10-2462008 B1 | 11/2022 |

* cited by examiner

*Primary Examiner* — Christopher J Kohlman
(74) *Attorney, Agent, or Firm* — Innovation Counsel LLP (57) ABSTRACT

According to embodiments of the disclosure, a pixel includes a first transistor connected between a first power line and a second power line, and having a gate electrode connected to a first node, a light emitting element connected between the first power line and the second power line, an initialization transistor connected between a third power line and an anode electrode of the light emitting element, and having a gate electrode connected to a first scan line, and a boosting capacitor connected between the first scan line and the anode electrode of the light emitting element.

16 Claims, 10 Drawing Sheets

PIXEL AND DISPLAY DEVICE INCLUDING THE SAME

This application claims priority to Korean Patent Application No. 10-2024-0006916, filed on Jan. 16, 2024, and all the benefits accruing therefrom under 35 U.S.C. § 119, the content of which in its entirety is herein incorporated by reference.

BACKGROUND

1. Field

The disclosure relates to a pixel and a display device including the same.

2. Description of the Related Art

As information technology is developed, importance of a display device which is a connection medium between a user and information has been highlighted. In response to this, a use of a display device such as a liquid crystal display device and an organic light emitting display device is increasing.

The display device displays an image using pixels. The pixels may include a first sub-pixel, a second sub-pixel, and a third sub-pixel emitting light of different colors, and each of the sub-pixels may be connected to various power lines. In order to secure degree of freedom for designing the sub-pixels or apply the sub-pixels to a high-resolution (and high pixels per inch (PPI)) display panel, the number of power lines connected to the sub-pixels is required to be minimized.

SUMMARY

An object of the disclosure is to provide a pixel and a display device including the same that may minimize the number of power lines connected to sub-pixels.

According to embodiments of the disclosure, a pixel includes a first transistor connected between a first power line and a second power line, and having a gate electrode connected to a first node, a light emitting element connected between the first power line and the second power line, an initialization transistor connected between a third power line and an anode electrode of the light emitting element, and having a gate electrode connected to a first scan line, and a boosting capacitor connected between the first scan line and the anode electrode of the light emitting element.

According to an embodiment, the pixel further includes a second transistor connected between a data line and a second node to which a first electrode of the first transistor is connected, and having a gate electrode connected to a second scan line, a third transistor connected between the first node and a third node to which a second electrode of the first transistor is connected, and having a gate electrode connected to a third scan line, a fourth transistor connected between the first node and a fourth power line and having a gate electrode connected to a fourth scan line, a fifth transistor connected between the first power line and the second node and having a gate electrode connected to an emission control line, a sixth transistor connected between the third node and the anode electrode of the light emitting element, and having a gate electrode connected to the emission control line, and a storage capacitor connected between the first power line and the first node.

According to an embodiment, the third transistor and the fourth transistor are N-type transistors, and the first transistor, the second transistor, the fifth transistor, the sixth transistor, and the initialization transistor are P-type transistors.

According to an embodiment, the first transistor further includes a second gate electrode electrically connected to the first power line.

According to an embodiment of the disclosure, a display device includes a first sub-pixel including a first initialization transistor supplying a voltage of initialization power to an anode electrode of a first light emitting element when a first scan signal is supplied to the first scan line, and a first boosting capacitor connected between the first scan line and the anode electrode of the first light emitting element, and a second sub-pixel including a second initialization transistor supplying a voltage of the initialization power to an anode electrode of a second light emitting element when the first scan signal is supplied to the first scan line.

According to an embodiment, the second sub-pixel does not include a boosting capacitor connected between the first scan line and the anode electrode of the second light emitting element.

According to an embodiment, the second light emitting element emits red light, and the first light emitting element emits a color other than the red light.

According to an embodiment, the display device further includes a third sub-pixel including a third initialization transistor supplying the voltage of the initialization power to an anode electrode of a third light emitting element when the first scan signal is supplied to the first scan line, and a second boosting capacitor connected between the first scan line and the anode electrode of the third light emitting element.

According to an embodiment, the first boosting capacitor and the second boosting capacitor have the same capacitance.

According to an embodiment, the first boosting capacitor and the second boosting capacitor have different capacitances.

According to an embodiment of the disclosure, a display device includes a first sub-pixel including a first pixel electrode layer, a second sub-pixel including a second pixel electrode layer, and a third sub-pixel including a third pixel electrode layer, and a first scan line extending in a first direction and electrically connected to the first sub-pixel, the second sub-pixel, and the third sub-pixel. The first pixel electrode layer and the third pixel electrode layer overlaps at least a portion of the first scan line, and the second pixel electrode layer does not overlap the first scan line.

According to an embodiment, the first scan line includes a first protrusion protruding in a second direction different from the first direction and at least partially overlapping the first pixel electrode layer, and a second protrusion protruding in the second direction and at least partially overlapping the third pixel electrode layer.

According to an embodiment, the display device further includes a first branch branched from the first pixel electrode layer and at least partially overlapping the first protrusion.

According to an embodiment, the display device further includes a second branch branched from the third pixel electrode layer and at least partially overlapping the second protrusion.

According to an embodiment, the first sub-pixel is a green sub-pixel, the second sub-pixel is a red sub-pixel, and the third sub-pixel is a blue sub-pixel.

According to an embodiment, a pixel electrode layer which includes the first pixel electrode layer, the second pixel electrode layer, and the third pixel electrode layer, and the first scan line are positioned in different layers.

According to an embodiment, the pixel electrode layer is positioned above the first scan line in a cross-sectional view.

Objects of the disclosure are not limited to the objects described above, and other technical objects which are not described will be clearly understood by those skilled in the art from the following description.

In accordance with the pixel and the display device including the same according to the embodiments of the disclosure, the anode electrode of the light emitting element included in each of the sub-pixels may receive the voltage of the initialization power from one power line. In addition, in the disclosure, an anode electrode voltage of the light emitting element included in each of the sub-pixels may be set differently using the boosting capacitor.

However, an effect of the disclosure is not limited to the above-described effect, and may be variously expanded without departing from the spirit and scope of the disclosure.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Hereinafter, various embodiments of the disclosure will be described in detail with reference to the accompanying drawings so that those skilled in the art may easily carry out the disclosure. The disclosure may be implemented in various different forms and is not limited to the embodiments described herein.

In order to clearly describe the disclosure, parts that are not related to the description are omitted, and the same or similar elements are denoted by the same reference numerals throughout the specification. Therefore, the above-described reference numerals may be used in other drawings.

In addition, sizes and thicknesses of each component shown in the drawings are arbitrarily shown for convenience of description, and thus the disclosure is not necessarily limited to those shown in the drawings. In the drawings, thicknesses may be exaggerated to clearly express various layers and areas.

In addition, an expression "is the same" in the description may mean "is substantially the same". That is, the expression "is the same" may be the same enough for those of ordinary skill to understand that it is the same. Other expressions may also be expressions in which "substantially" is omitted.

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the inventive concept. In addition, in some embodiments, the block, unit and/or module may be physically combined into more complex blocks, units, and/or modules without departing from the scope of the inventive concept.

A term "connection" between two configurations may mean that both of an electrical connection and a physical connection are used inclusively, but is not limited thereto. For example, "connection" used based on a circuit diagram may mean an electrical connection, and "connection" used based on a cross-sectional view and a plan view may mean a physical connection.

Although a first, a second, and the like are used to describe various components, these components are not limited by these terms. These terms are used only to distinguish one component from another component. Therefore, a first component described below may be a second component within the technical spirit of the disclosure. The singular expression includes the plural expression unless the context clearly dictates otherwise.

Meanwhile, the disclosure is not limited to the embodiments disclosed below, and may be modified in various forms and may be implemented. In addition, each of the embodiments disclosed below may be implemented alone or in combination with at least one of other embodiments.

Figure 1:
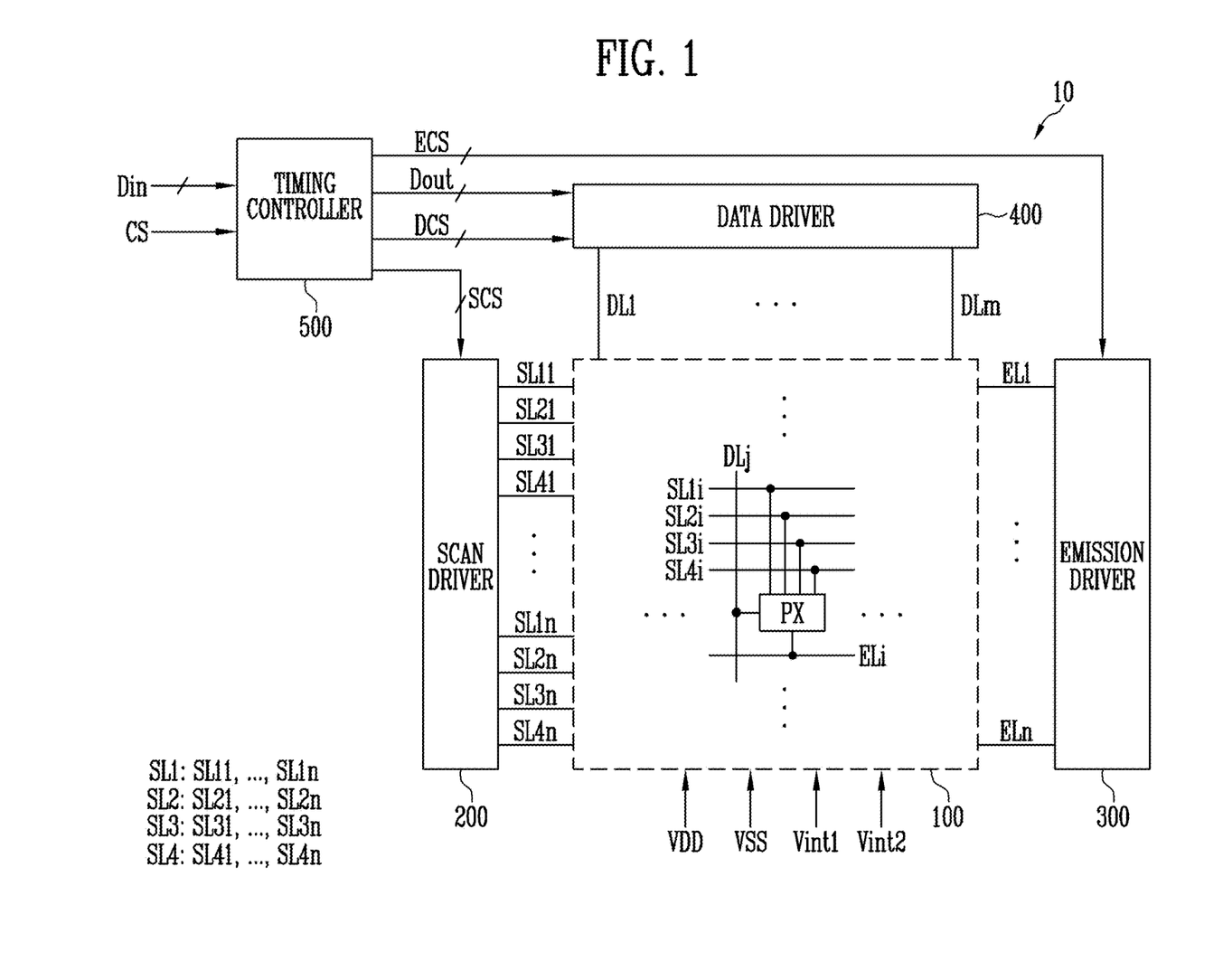
FIG. 1 is a diagram illustrating a display device according to an embodiment of the disclosure.

FIG. 1 is a diagram illustrating a display device according to an embodiment of the disclosure.

Referring to FIG. 1, the display device 10 may include a pixel unit 100, a scan driver 200, an emission driver 300, a data driver 400, and a timing controller 500.

The display device 10 may display an image at various frame frequencies (driving frequency, refresh rate, or screen reproduction rate) according to a driving condition. The frame frequency is a frequency at which a data voltage is substantially written to a driving transistor of a sub-pixel PX (or a pixel) for one second. For example, the frame frequency is also referred to as a screen scan rate or a screen reproduction frequency, and indicates a frequency at which a display screen is reproduced for one second.

In an embodiment, an output frequency of a second scan signal supplied from a second scan line SL2 and/or data signal supply from the data driver 400 may be changed in response to the frame frequency. For example, a frame frequency for moving image driving may be a frequency of about 60 Hz or higher (for example, 60 Hz, 120 Hz, or 240 Hz). When the frame frequency is 60 Hz, the second scan signal may be supplied 60 times per second to each horizontal line (or pixel row).

In an embodiment, the display device 10 may adjust an output frequency of the scan driver 200 and the emission driver 300, and an output frequency of the data driver 400 corresponding to the output frequency of the scan driver 200 and the emission driver 300 according to the driving condition. For example, the display device 10 may display an image in response to various frame frequencies of 1 Hz to 120 Hz. However, this is an example, and the display device 10 may display an image at a frame frequency of 120 Hz or higher (for example, 240 Hz or 480 Hz).

The pixel unit 100 may include scan lines SL11 to SL1n, SL21 to SL2n, SL31 to SL3n, and SL41 to SL4n, emission control lines EL1 to ELn, and data lines DL1 to DLm, and may include the sub-pixels PX connected to the scan lines SL11 to SL1n, SL21 to SL2n, SL31 to SL3n, and SL41 to SL4n, the emission control lines EL1 to ELn, and the data lines DL1 to DLm (here, m and n are natural numbers greater than 2). Each of the sub-pixels PX may include a driving transistor and a plurality of switching transistors.

Each of the sub-pixels PX may emit one of a first color, a second color, or a third color to an outside. The first color, the second color, and the third color may be different colors. For example, the first color may be set to green, the second color may be set to red, and the third color may be set to blue. In another embodiment, the first color may be set to magenta, the second color may be set to cyan, and the third color may be set to yellow.

The timing controller 500 may receive input data Din and control signals CS from a host system such as an application processor (AP) through a predetermined interface. The timing controller 500 may control a driving timing of the scan driver 200, the emission driver 300, and the data driver 400. For example, the timing controller 500 may generate a scan driving signal SCS, an emission driving signal ECS, and a data driving signal DCS, and supply the scan driving signal SCS, the emission driving signal ECS, and the data driving signal DCS to the scan driver 200, the emission driver 300, and the data driver 400, respectively. In addition, the timing controller 500 may correct (and/or rearrange) the input data Din to generate output data Dout and supply the output data Dout to the data driver 400.

The scan driver 200 may receive the scan driving signal SCS from the timing controller 500 and respectively supply a first scan signal, a second scan signal, a third scan signal, and a fourth scan signal to the first scan lines SL1, the second scan lines SL2, the third scan lines SL3, and the fourth scan lines SL4 based on the scan driving signal SCS.

Each of the first to fourth scan signals may be set to a gate-on voltage corresponding to a type of a transistor to which a corresponding scan signal is supplied. The transistor receiving the scan signal may be turned-on when the scan signal is supplied. For example, a gate-on voltage of a scan signal supplied to a P-channel metal oxide semiconductor (PMOS) transistor may be a logic low level, and a gate-on voltage of a scan signal supplied to an N-channel metal oxide semiconductor (NMOS) transistor may be a logic high level. Hereinafter, a meaning of "the scan signal is supplied" may be understood as that the scan signal is supplied at a logic level that turns on a transistor controlled thereby.

The emission driver 300 may receive the emission driving signal ECS from the timing controller 500, and supply an emission control signal to the emission control lines EL1 to ELn based on the emission driving signal ECS. For example, the emission driver 300 may generate the emission control signal by shifting an emission start signal included in the emission driving signal ECS using a clock signal. To this end, the emission driver 300 may include a shift register, and may sequentially supply the emission control signal to the emission control lines EL1 to ELn.

The emission control signal may be a gate-off voltage (for example, a high voltage). A transistor receiving the emission control signal may be turned off when the emission control signal is supplied, and may be turned on in other cases. Hereinafter, a meaning of "the emission control signal is supplied" may be understood as that the emission control signal is supplied at a logic level that turns off a transistor controlled thereby.

In FIG. 1, for convenience of description, each of the scan driver 200 and the emission driver 300 is shown as a single configuration, but the disclosure is not limited thereto. According to a design, the scan driver 200 may include a plurality of scan drivers each supplying at least one of the first to fourth scan signals. In addition, at least a portion of the scan driver 200 and the emission driver 300 may be integrated into one driving circuit, module, or the like.

The data driver 400 may receive the data driving signal DCS and the output data Dout from the timing controller 500. The data driver 400 may convert the digital output data Dout into an analog data signal (or data voltage) in response to the data driving signal DCS. The data driver 400 may supply a data signal to the data lines DL1 to DLm. For example, the data driver 400 may supply the data signal to the data lines DL1 to DLm in synchronization with the second scan signal supplied from the second scan lines SL21 to SL2n.

In an embodiment, the display device 10 may further include a power supply. The power supply may supply a voltage of first driving power VDD, a voltage of second driving power VSS, a voltage of first initialization power Vint1, and a voltage of second initialization power Vint2 for driving the sub-pixel PX to the pixel unit 100.

Figure 2:
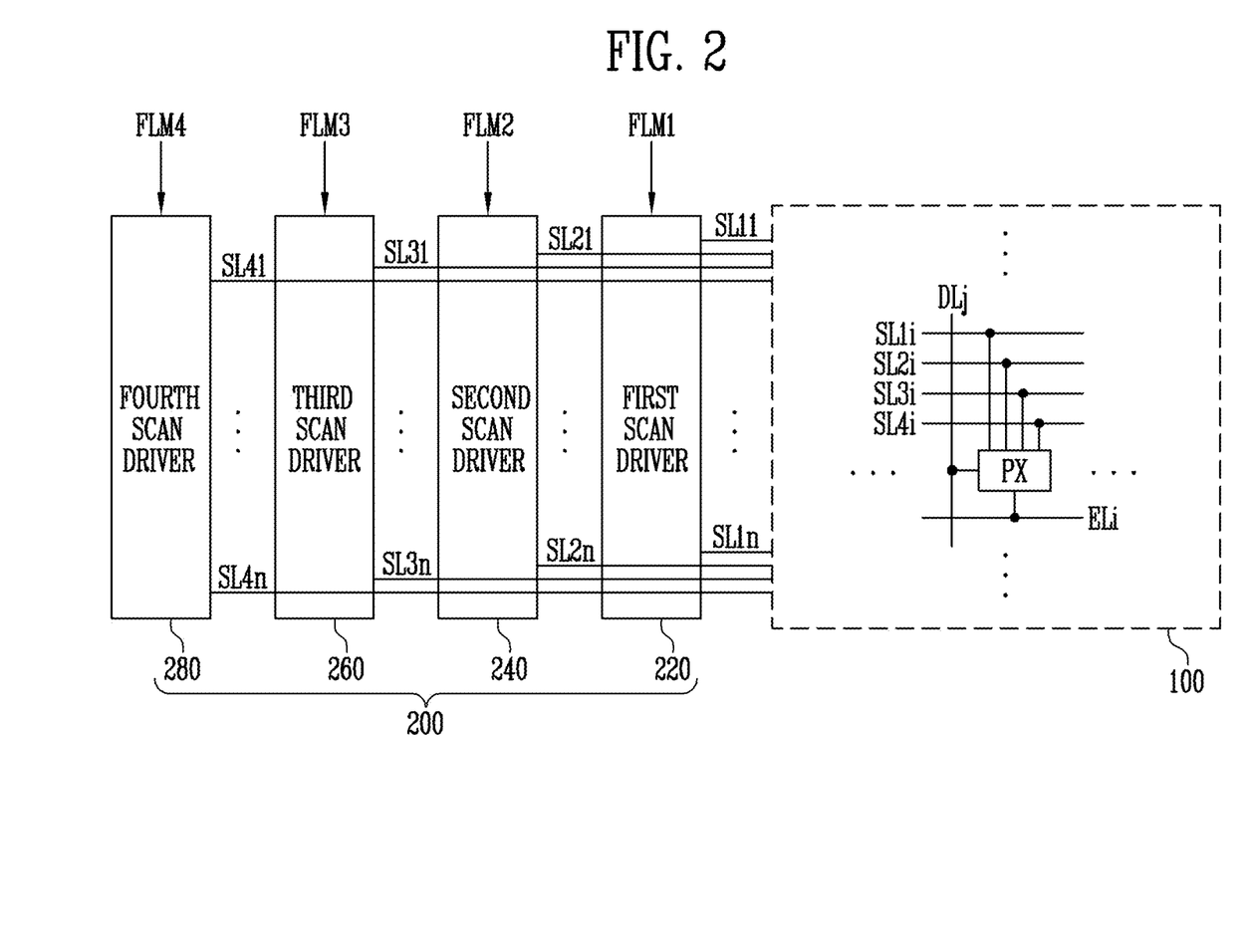
FIG. 2 is a diagram illustrating an embodiment of a scan driver included in the display device of FIG. 1.

FIG. 2 is a diagram illustrating an embodiment of the scan driver included in the display device of FIG. 1.

Referring to FIG. 2, the scan driver 200 may include a first scan driver 220, a second scan driver 240, a third scan driver 260, and a fourth scan driver 280.

The scan drive signal SCS may include first to fourth scan start signals FLM1 to FLM4. The first to fourth scan start signals FLM1 to FLM4 may be supplied to the first to fourth scan drivers 220 to 280, respectively. A width, a supply timing, and the like of the first to fourth scan start signals FLM1 to FLM4 may be determined according to a driving condition and a frame frequency of the sub-pixel PX.

The first scan driver 220 may sequentially supply the first scan signal to the first scan lines SL11 to SL1n in response to the first scan start signal FLM1. The second scan driver 240 may sequentially supply the second scan signal to the second scan lines SL21 to SL2n in response to the second scan start signal FLM2. The third scan driver 260 may sequentially supply the third scan signal to the third scan lines SL31 to SL3n in response to the third scan start signal FLM3. The fourth scan driver 280 may sequentially supply the fourth scan signal to the fourth scan lines SL41 to SL4n in response to the fourth scan start signal FLM4.

Figure 3A:
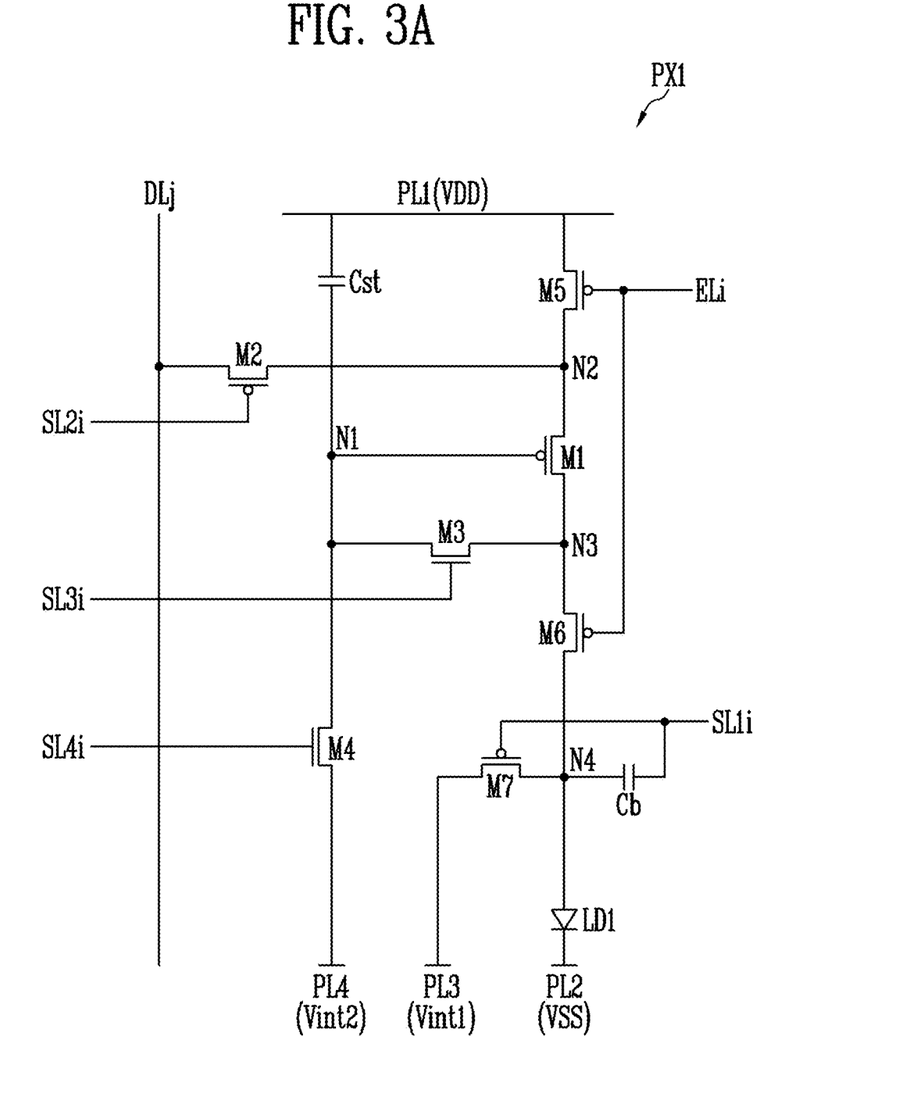
FIGS. 3A and 3B are diagrams illustrating an embodiment of a first sub-pixel included in the display device of FIG. 1.
Figure 3B:
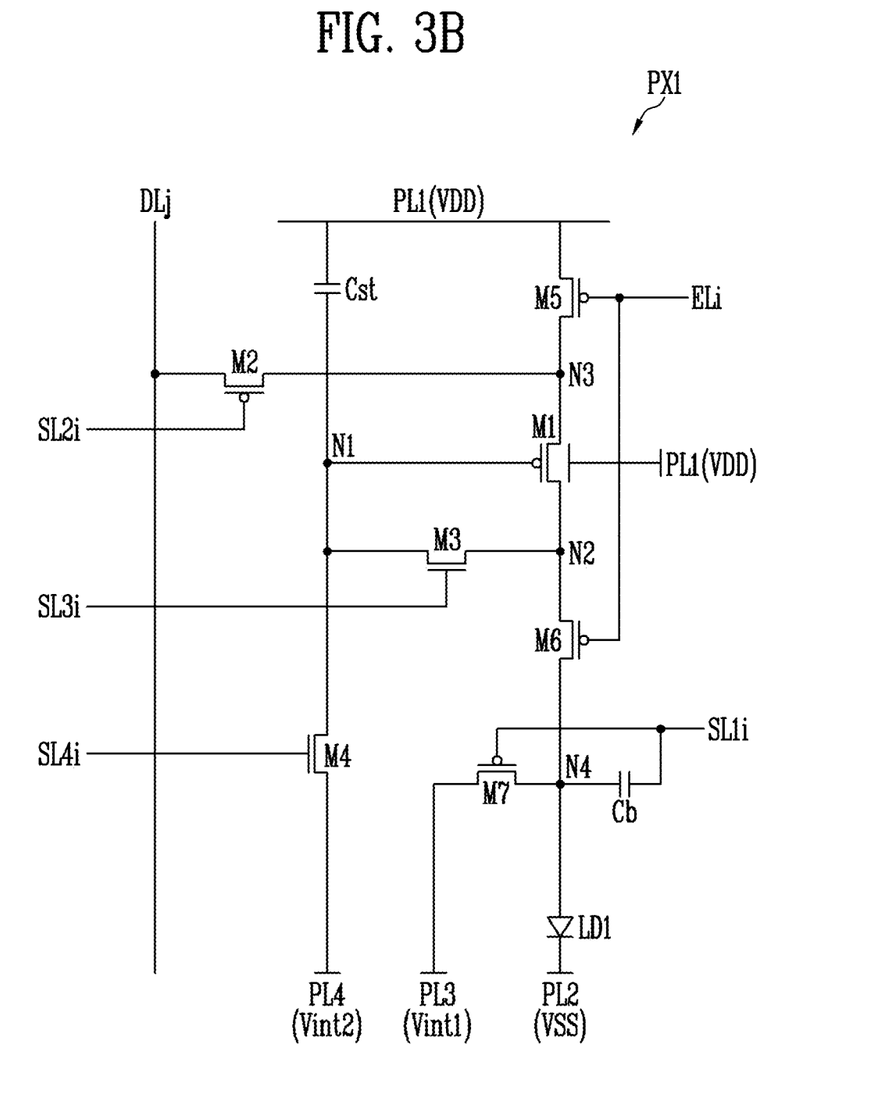

FIGS. 3A and 3B are diagrams illustrating an embodiment of the first sub-pixel included in the display device of FIG. 1. In FIGS. 3A and 3B, it is assumed that the first sub-pixel PX1 is positioned on an i-th horizontal line (or an i-th pixel row) and is connected to a j-th data line DLj (here, I and j are natural numbers greater than or equal to 1).

Referring to FIGS. 3A and 3B, the first sub-pixel PX1 according to an embodiment of the disclosure includes a first light emitting element LD1 and a pixel circuit for controlling a current amount supplied to the first light emitting element LD1.

A first electrode (or an anode electrode) of the first light emitting element LD1 may be connected to a fourth node N4, and a second electrode (or a cathode electrode) of the first light emitting element LD1 may be connected to a second power line PL2 supplied with the second driving power VSS. The first light emitting element LD1 may generate light of a predetermined luminance in response to a current amount supplied from a first transistor M1.

The first light emitting element LD1 may be an organic light emitting diode. In addition, the first light emitting element LD1 may be an inorganic light emitting diode such as a micro light emitting diode (LED) or a quantum dot light emitting diode. In addition, the first light emitting element LD1 may be an element in which an organic material and an inorganic material are combined. In FIGS. 3A and 3B, the first sub-pixel PX1 includes a single first light emitting element LD1, but in another embodiment, the first sub-pixel PX1 may include a plurality of light emitting elements which are connected in series, in parallel, or in series-parallel with each other.

The pixel circuit may include first to seventh transistors M1 to M7, a storage capacitor Cst, and a boosting capacitor Cb.

A first electrode of the first transistor M1 (or a driving transistor) may be connected to a second node N2, and a second electrode may be connected to a third node N3. In addition, a gate electrode of the first transistor M1 may be connected to a first node N1. The first transistor M1 may control a current amount supplied from the first driving power VDD to the second driving power VSS via the light emitting element LD in response to a voltage of the first node N1. To this end, the first driving power VDD may be set to a voltage higher than that of the second driving power VSS.

The second transistor M2 may be connected between the data line DLj and the second node N2. In addition, a gate electrode of the second transistor M2 may be connected to the second scan line SL2i. The second transistor M2 may be turned on when the second scan signal is supplied from the second scan line SL2i to electrically connect the data line DLj and the second node N2.

The third transistor M3 may be connected between the first node N1 and the third node N3. In addition, a gate electrode of the third transistor M3 may be connected to the third scan line SL3i. The third transistor M3 may be turned on when the third scan signal is supplied to the third scan line SL3i to electrically connect the first node N1 and the third node N3. When the third transistor M3 is turned on, the first transistor M1 is diode connected.

The fourth transistor M4 is connected between the first node N1 and the fourth power line PL4 to which the second initialization power Vint2 is supplied. In addition, a gate electrode of the fourth transistor M4 is connected to the fourth scan line SL4i. The fourth transistor M4 may be turned on when the fourth scan signal is supplied from the fourth scan line SL4i to supply a voltage of the second initialization power Vint2 to the first node N1. Here, the voltage of the second initialization power Vint2 may be set to a voltage lower than the data signal supplied from the data line DLj.

The fifth transistor M5 is connected between a first power line PL1 to which the first driving power VDD is supplied and the second node N2. In addition, a gate electrode of the fifth transistor M5 may be connected to the emission control line ELi. The fifth transistor M5 may be turned off when the emission control signal is supplied to the emission control line ELi, and may be turned on in other cases.

The sixth transistor M6 is connected between the third node N3 and the fourth node N4. In addition, a gate electrode of the sixth transistor M6 may be connected to the emission control line ELi. The sixth transistor M6 may be turned off when the emission control signal is supplied from the emission control line ELi, and may be turned on in other cases. Meanwhile, in FIGS. 3A and 3B, the fifth transistor M5 and the sixth transistor M6 are connected to the same emission control line ELi, but the disclosure is not limited thereto. In an embodiment, the fifth transistor M5 and the sixth transistor M6 may be connected to different emission control lines.

The seventh transistor M7 (an initialization transistor, or a first initialization transistor) is connected between the fourth node N4 (that is, the first electrode of the first light emitting element LD1) and a third power line PL3 to which the first initialization power Vint1 is supplied. In addition, a gate electrode of the seventh transistor M7 may be connected to the first scan line SL1i. The seventh transistor M7 may be turned on when the first scan signal is supplied from the first scan line SL1i to supply a voltage of the first initialization power Vint1 to the fourth node N4.

When the voltage of the first initialization power Vint1 is supplied to the fourth node N4, a parasitic capacitor of the first light emitting element LD1 may be discharged. As a residual voltage charged in the parasitic capacitor of the first light emitting element LD1 is discharged (or removed), unintentional emission of the first light emitting element LD1 may be prevented. Accordingly, black expression ability of the first sub-pixel PX1 may be improved.

Meanwhile, the first initialization power Vint1 and the second initialization power Vint2 may be set to voltages different from each other. That is, a voltage for initializing the first node N1 and a voltage for initializing the fourth node N4 may be set differently. However, this is an example, and the voltage of the first initialization power Vint1 and the voltage of the second initialization power Vint2 may be substantially the same.

The storage capacitor Cst is connected between the first power line PL1 and the first node N1. The storage capacitor Cst may store a voltage applied to the first node N1.

The boosting capacitor Cb is connected between the first scan line SL1i and the fourth node N4. The boosting capacitor Cb may control a voltage of the fourth node N4 in response to a voltage of the first scan line SL1i. That is, the boosting capacitor Cb may be driven as a coupling capacitor.

In an embodiment, the first transistor M1, the second transistor M2, the fifth transistor M5, the sixth transistor M6, and the seventh transistor M7 may be formed of a polysilicon semiconductor transistor. For example, the first transistor M1, the second transistor M2, the fifth transistor M5, the sixth transistor M6, and the seventh transistor M7 may include a polysilicon semiconductor layer formed through a low temperature poly-silicon (LTPS) process as an active layer (channel). In addition, the first transistor M1, the second transistor M2, the fifth transistor M5, the sixth transistor M6, and the seventh transistor M7 may be a P-type transistor (for example, a PMOS transistor). Accordingly, a gate-on voltage that turns on the first transistor M1, the second transistor M2, the fifth transistor M5, the sixth transistor M6, and the seventh transistor M7 may be a logic low level.

Since the polysilicon semiconductor transistor has an advantage of a fast response speed, the polysilicon semiconductor transistor may be used as a switching element requiring fast switching.

In an embodiment, the third transistor M3 and the fourth transistor M4 may be formed of an oxide semiconductor transistor. For example, the third transistor M3 and the fourth transistor M4 may be an N-type oxide semiconductor transistor (for example, an NMOS transistor), and may include an oxide semiconductor layer as an active layer. Accordingly, a gate-on voltage that turns on the third transistor M3 and the fourth transistor M4 may be a logic high level.

The oxide semiconductor transistor may be formed at a low temperature and has a charge mobility lower than that of a polysilicon semiconductor transistor. That is, the oxide semiconductor transistor has an excellent off current characteristic. Therefore, when the third transistor M3 and the fourth transistor M4 are formed of an oxide semiconductor transistor, a leakage current from the first node N1 when the sub-pixel is driven at a low-frequency may be minimized, and thus display quality may be improved.

Meanwhile, as shown in FIG. 3B, the first transistor M1 may include a first gate electrode and a second gate electrode. The first gate electrode may be connected to the first node N1, and the second gate electrode may be connected to the first power line PL1. When the first transistor M1 includes the second gate electrode, on current may be increased.

Figure 5:
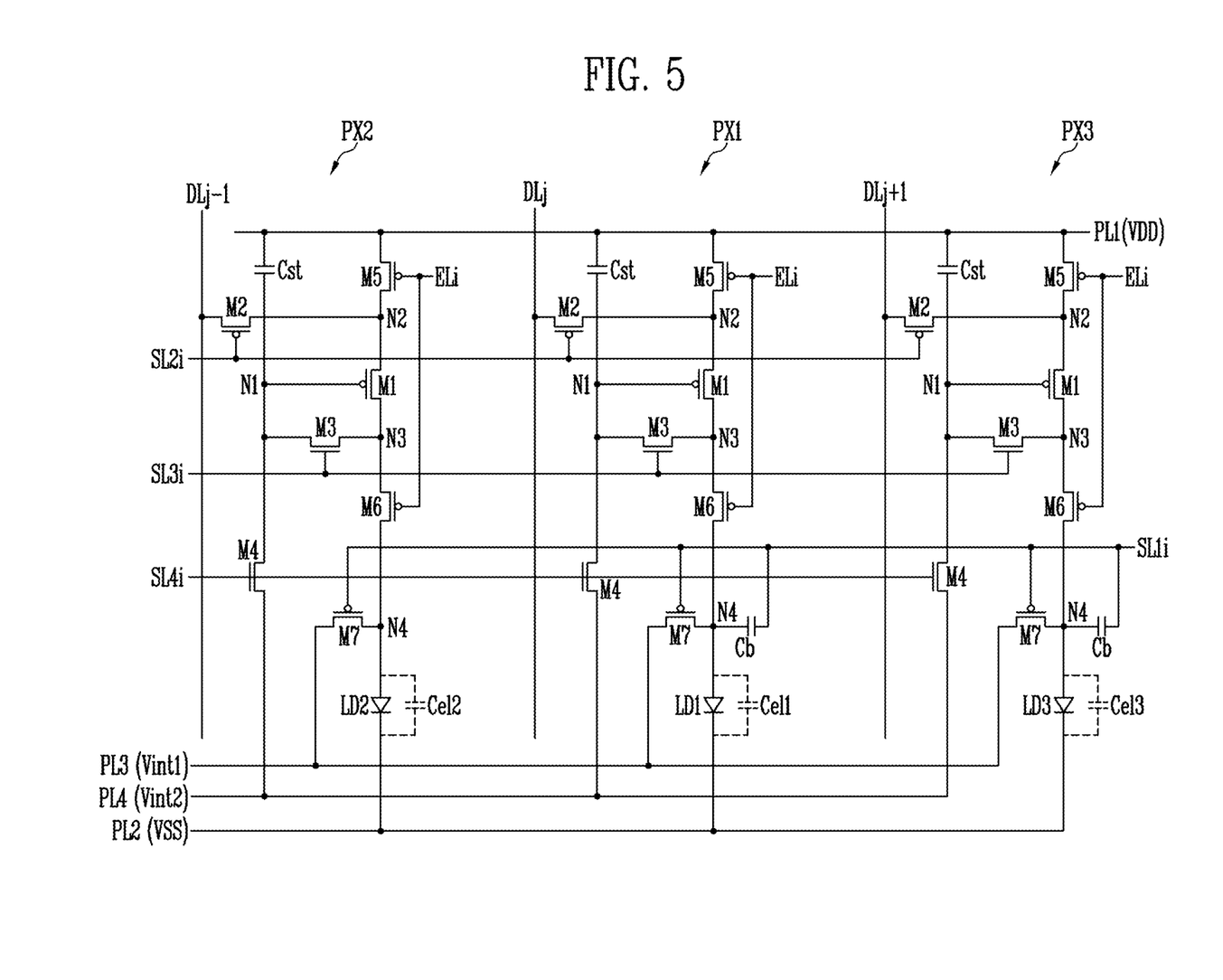
FIG. 5 is a diagram illustrating sub-pixels according to an embodiment of the disclosure.

The first light emitting element LD1 included in the first sub-pixel PX1 may emit green light. As shown in FIG. 5, a third light emitting element LD3 included in the third sub-pixel PX3 emitting blue light may emit blue light. A circuit structure of the third sub-pixel PX3 is the same as that of the first sub-pixel PX1, and a detailed description related to this is omitted.

Figure 4A:
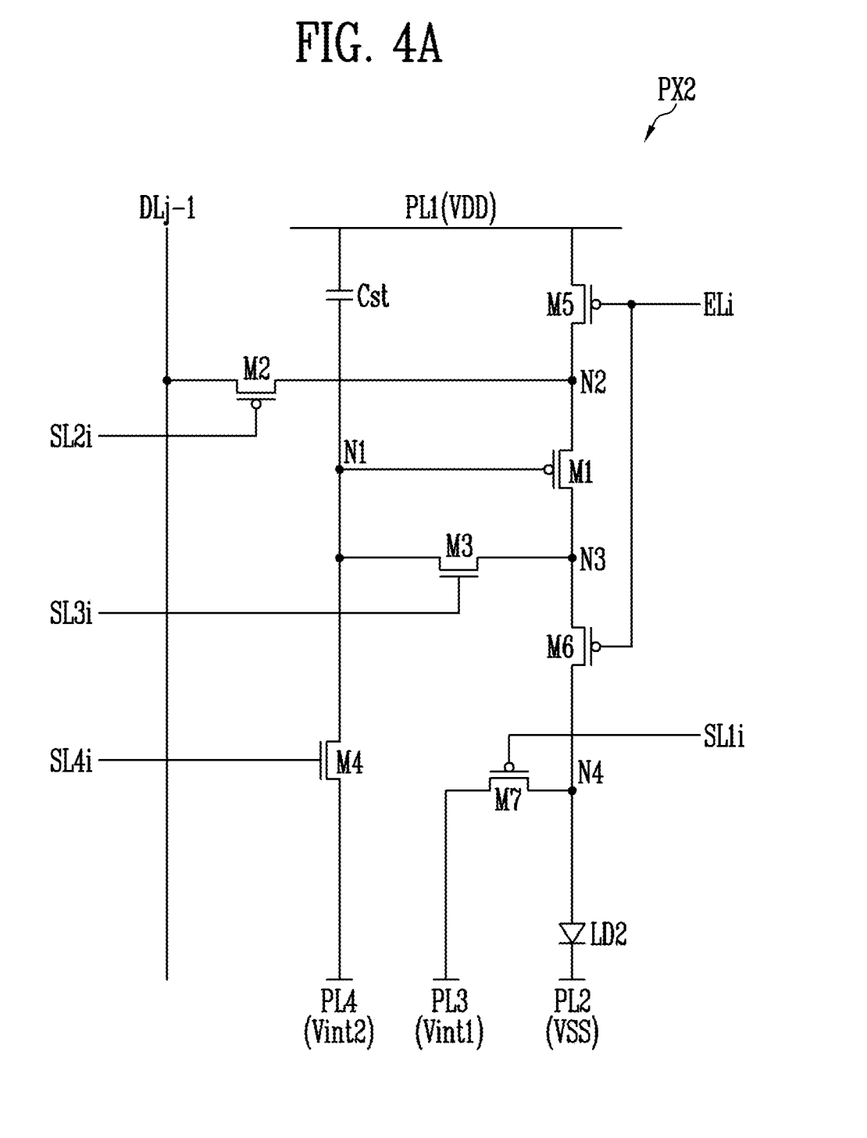
FIGS. 4A and 4B are diagrams illustrating an embodiment of a second sub-pixel included in the display device of FIG. 1.
Figure 4B:
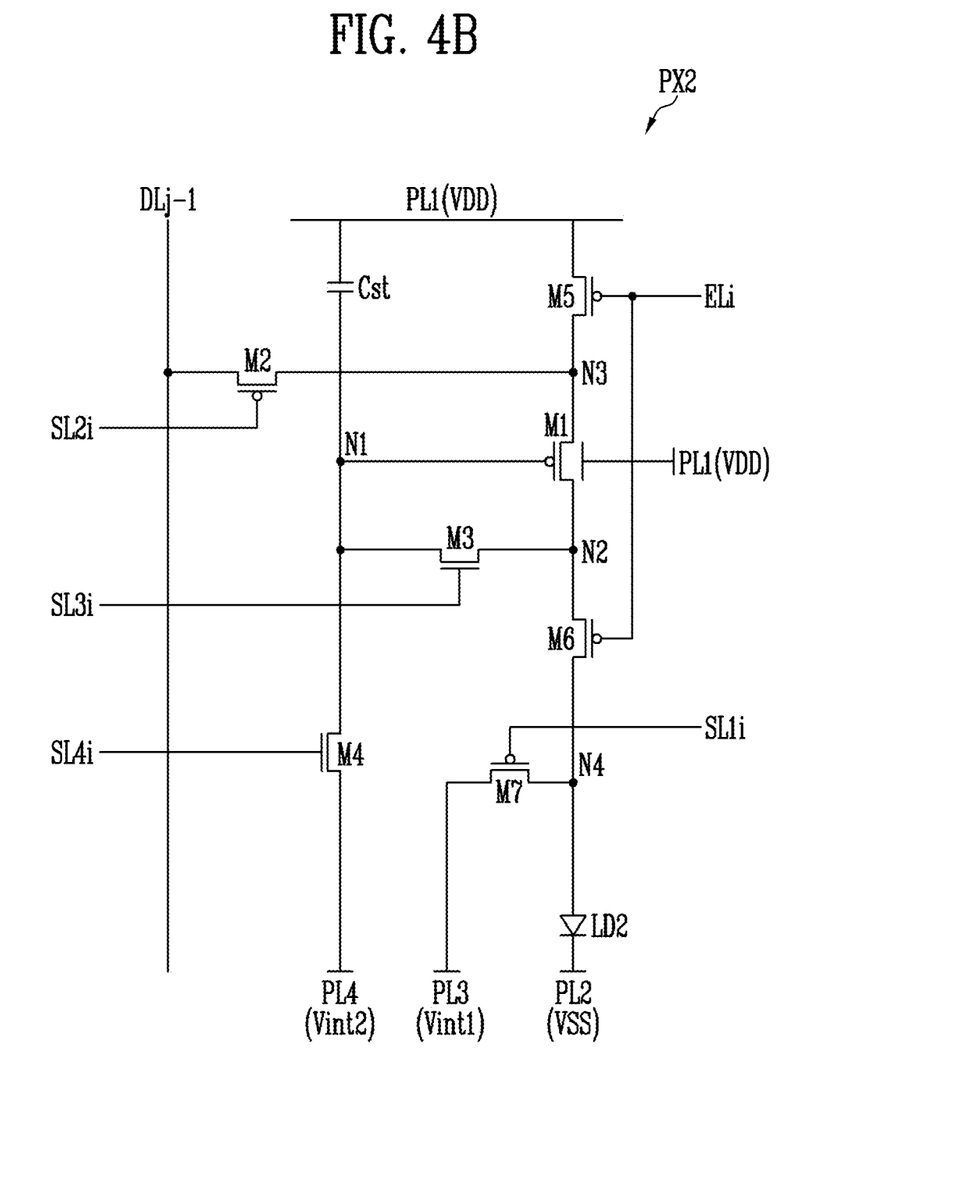

FIGS. 4A and 4B are diagrams illustrating an embodiment of the second sub-pixel included in the display device of FIG. 1. When describing FIGS. 4A and 4B, the same reference numerals are assigned to configurations that perform the same functions as those of FIGS. 3A and 3B, and an overlapping description is omitted. In FIGS. 4A and 4B, it is assumed that the second sub-pixel PX2 is positioned on the i-th horizontal line (or the i-th pixel row) and is connected to a (j−1)-th data line DLj−1.

Referring to FIGS. 4A and 4B, the second sub-pixel PX2 according to an embodiment of the disclosure includes a second light emitting element LD2 and a pixel circuit for controlling a current amount supplied to the second light emitting element LD2.

A first electrode (or an anode electrode) of the second light emitting element LD2 may be connected to a fourth node N4, and a second electrode (or a cathode electrode) of the second light emitting element LD2 may be connected to a second power line PL2 supplied with the second driving power VSS. The second light emitting element LD2 may generate light of a predetermined luminance in response to a current amount supplied from a first transistor M1. For example, the second light emitting element LD2 may generate red light.

The second light emitting element LD2 may be an organic light emitting diode. In addition, the second light emitting element LD2 may be an inorganic light emitting diode such as a micro light emitting diode (LED) or a quantum dot light emitting diode. In addition, the second light emitting element LD2 may be an element in which an organic material and an inorganic material are combined. In FIGS. 4A and 4B, the second sub-pixel PX2 includes a single second light emitting element LD2, but in another embodiment, the second sub-pixel PX2 may include a plurality of light emitting elements which are connected in series, in parallel, or in series-parallel with each other.

The pixel circuit may include first to seventh transistors M1 to M7 and a storage capacitor Cst.

The seventh transistor M7 (a second initialization transistor) is connected to the fourth node N4 (that is, the first electrode of the second light emitting element LD2) and a third power line PL3 to which the first initialization power Vint1 is supplied. In addition, a gate electrode of the seventh transistor M7 may be connected to a first scan line SL1$i$. The seventh transistor M7 may be turned on when the first scan signal is supplied from the first scan line SL1$i$ to supply the voltage of the first initialization power Vint1 to the fourth node N4.

The second sub-pixel PX2 does not include the boosting capacitor Cb compared to the first sub-pixel PX1. That is, a structure of the second sub-pixel PX2 excluding the boosting capacitor Cb may be the same as that of the first sub-pixel PX1.

A gate electrode (or a first gate electrode) of the first transistor M1 included in the second sub-pixel PX2 may be connected to the first node N1 as shown in FIG. 4A. In addition, as shown in FIG. 4B, the first transistor M1 may further include a second gate electrode, and the second gate electrode may be electrically connected to the first power line PL1 to which the first driving power VDD is supplied.

FIG. 5 is a diagram illustrating sub-pixels according to an embodiment of the disclosure.

Referring to FIG. 5, in an embodiment of the disclosure, the display device 10 may include the first sub-pixel PX1, the second sub-pixel PX2, and the third sub-pixel PX3.

As described with reference to FIGS. 3A to 4B, each of the first sub-pixel PX1 and the third sub-pixel PX3 includes the boosting capacitor Cb, and the second sub-pixel PX2 does not include the boosting capacitor Cb. In this case, even though the first initialization power Vint1 is supplied to the fourth node N4 (that is, the anode electrode of the light emitting elements LD1, LD2, and LD3) of the respective sub-pixels PX1 to PX3 using one power line (that is, the third power line PL3), voltages of the fourth node N4 included in the first sub-pixel PX1 (and the third sub-pixel PX3) and the fourth node N4 included in the second sub-pixel PX2 may be set differently.

More specifically, the first light emitting element LD1, the second light emitting element LD2, and the third light emitting element LD3 may be formed of different materials. In addition, areas occupied by the first light emitting element LD1, the second light emitting element LD2, and the third light emitting element LD3 in respective areas of the sub-pixels PX1 to PX3 may be different.

In this case, a capacitance of parasitic capacitors Cel1, Cel2, and Cel3 formed in the respective light emitting elements LD1 to LD3 may be set differently. For example, a capacitance of the second parasitic capacitor Cel2 included in the second sub-pixel PX2 may be greater than a capacitance of the first parasitic capacitor Cel1 and the third parasitic capacitor Cel3 included in the first sub-pixel PX1 and the third sub-pixel PX3.

The voltage of the first initialization power Vint1 supplied from the third power line PL3 to the fourth node N4 of each of the sub-pixels PX1 to PX3 may initialize a voltage stored in the parasitic capacitors Cel1, Cel2, and Cel3. In this case, a lower voltage is required to be supplied to the fourth node N4 of the second sub-pixel PX2 compared to the first sub-pixel PX1 and the third sub-pixel PX3.

To this end, a method of supplying the first initialization power Vint1 of different voltages to the first sub-pixel PX1 and third sub-pixel PX3, and the second sub-pixel PX2 may be proposed. For example, the first sub-pixel PX1 and the third sub-pixel PX3, and the second sub-pixel PX2 may be supplied with different voltages via different power lines. However, when a power line is added, applying it to a high-resolution (and high pixels per inch (PPI)) display panel may be difficult. In addition, an inspection pad or the like for inspecting whether the added power line is abnormal is required to be added.

To prevent this, in an embodiment of the disclosure, by adding the boosting capacitor Cb to the first sub-pixel PX1 and the third sub-pixel PX3, the voltages of the fourth node N4 of each of the first sub-pixel PX1 and the third sub-pixel PX3 and the fourth node N4 of the second sub-pixel PX2 may be set differently. For example, the boosting capacitor Cb included in each of the first sub-pixel PX1 and the third sub-pixel PX3 may increase the voltage of the fourth node N4 included in each of the first sub-pixel PX1 and the third sub-pixel PX3. A detailed description related to this is provided later with reference to FIG. 7.

Figure 6A:
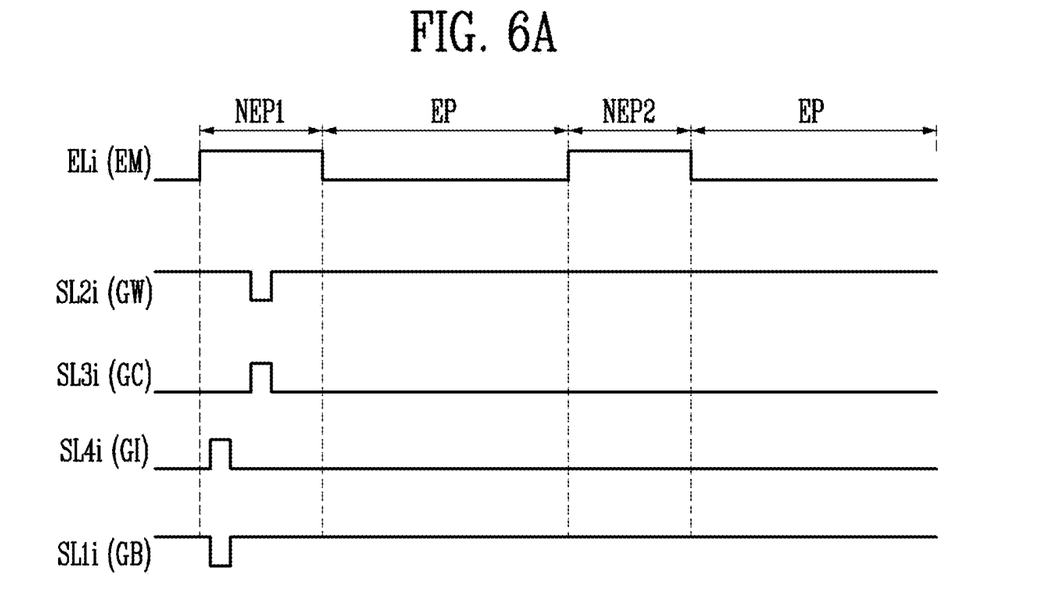
FIGS. 6A and 6B are diagrams illustrating an embodiment of signals supplied to the sub-pixels in one frame period.
Figure 6B:
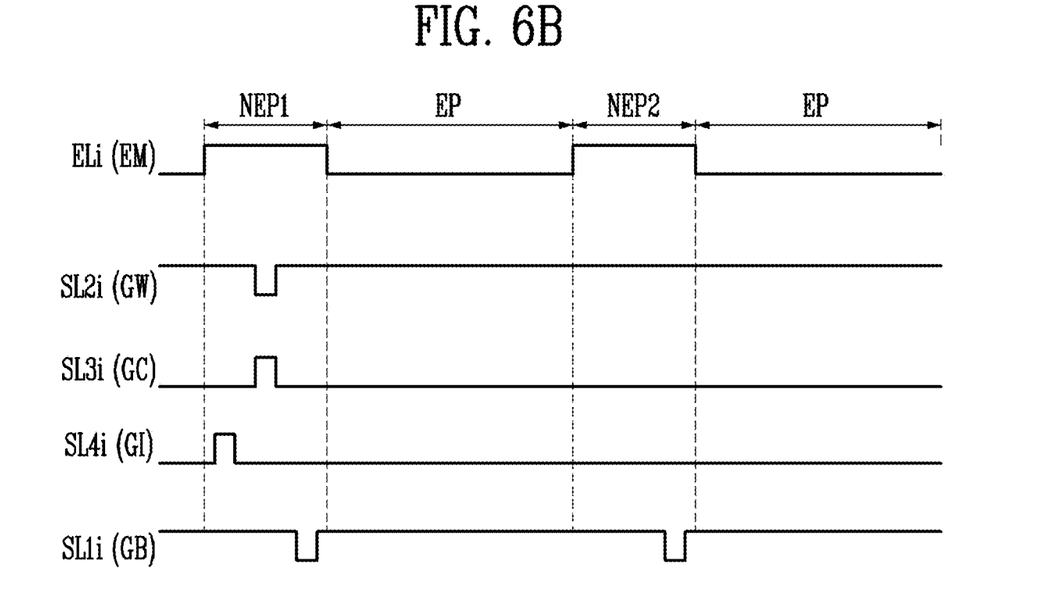
Figure 7:
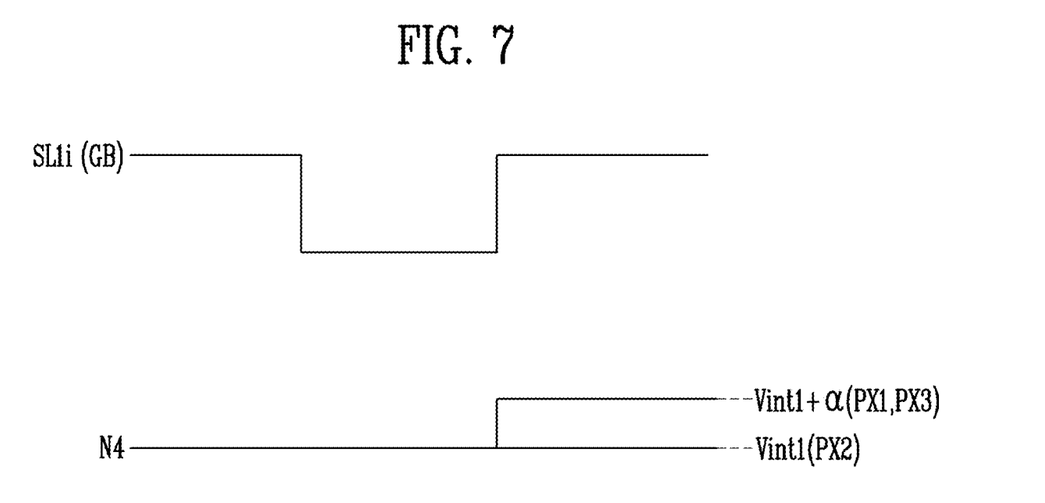
FIG. 7 is a diagram illustrating a voltage of a fourth node included in each of the sub-pixels corresponding to a first scan signal.

FIGS. 6A and 6B are diagrams illustrating an embodiment of signals supplied to the sub-pixels in one frame period. For convenience of description, an operation process corresponding to FIGS. 6A and 6B is described in conjunction with the second sub-pixel PX2 shown in FIG. 4A. FIG. 7 is a diagram illustrating the voltage of the fourth node included in each of the sub-pixels corresponding to the first scan signal.

Referring to FIGS. 6A to 7, one frame period may include an emission period EP, a first non-emission period NEP1, and a second non-emission period NEP2. The emission period EP may be adjacent to each of the first non-emission period NEP1 and the second non-emission period NEP2.

In FIGS. 6A and 6B, the two non-emission periods NEP1 and NEP2 are included in one frame period, but the disclosure is not limited thereto. For example, the number of non-emission periods NEP1 and NEP2 included in one frame period may be set variously according to the frame frequency and/or setting of the display device 10.

The first non-emission period NEP1 may refer to a period in which the data signal is written. The second non-emission period NEP2 may refer to a period in which a previous data signal is maintained and the sub-pixels PX1 to PX3 do not emit light. When a plurality of non-emission periods are included in one frame period, motion blur and the like may be reduced, and thus image quality may be improved.

An emission control signal EM may be supplied a plurality of times during one frame period. That is, the emission control signal EM may have an off period corresponding to the first non-emission period NEP1 and the second non-emission period NEP2. Here, the off period of the emission control signal may refer to a period in which the emission control signal is supplied and thus the fifth transistor M5 and the sixth transistor M6 are turned off. The off period may include a first off period corresponding to the first non-emission period NEP1 and a second off period corresponding to the second non-emission period NEP2.

Describing an operation process, first, the fifth transistor M5 and the sixth transistor M6 are turned off by the emission control signal EM supplied to the emission control line ELi during the first non-emission period NEP1. When the fifth transistor M5 and the sixth transistor M6 are turned off, electrical connection between the first power line PL1 and the second light emitting element LD2 is blocked, and thus the second light emitting element LD2 is set to a non-emission state.

Thereafter, a fourth scan signal GI is supplied to the fourth scan line SL4i, and a first scan signal GB is supplied to the first scan line SL1i. When the fourth scan signal GI is supplied to the fourth scan line SL4i, the fourth transistor M4 is turned on, and when the first scan signal GB is supplied to the first scan line SL1i, the seventh transistor M7 is turned on.

When the fourth transistor M4 is turned on, the voltage of the second initialization power Vint2 is supplied to the first node N1, and thus the first node N1 is initialized to the voltage of the second initialization power Vint2. When the seventh transistor M7 is turned on, the voltage of the first initialization power Vint1 is supplied to the fourth node N4, and thus the anode electrode of the second light emitting element LD2 is initialized to the voltage of the first initialization power Vint1.

Thereafter, a second scan signal GW is supplied to the second scan line SL2i, and a third scan signal GC is supplied to the third scan line SL3i. When the second scan signal GW is supplied to the second scan line SL2i, the second transistor M2 is turned on. When the third scan signal GC is supplied to the third scan line SL3i, the third transistor M3 is turned on.

When the second transistor M2 is turned on, the data line DLj-1 and the second node N2 are electrically connected, and thus the data signal is supplied from the data line DLj-1 to the second node N2. When the third transistor M3 is turned on, the first transistor M1 is connected in a diode form. In this case, the data signal supplied to the second node N2 is supplied to the first node N1 via the first transistor M1 connected in the diode form and third transistor M3 which is turned on. Therefore, a voltage corresponding to the data signal and a threshold voltage of the first transistor M1 may be applied to the first node N1. The storage capacitor Cst stores the voltage applied to the first node N1.

After the data signal and the voltage corresponding to the threshold voltage of the first transistor M1 are stored in the storage capacitor Cst, supply of the emission control signal EM is stopped. When supply of the emission control signal EM is stopped, the fifth transistor M5 and the sixth transistor M6 are turned on. When the fifth transistor M5 and the sixth transistor M6 are turned on, the first power line PL1 may be electrically connected to the anode electrode of the second light emitting element LD2 via the fifth transistor M5, the first transistor M1, and the sixth transistor M6. The first transistor M1 supplies a driving current corresponding to the voltage applied to the first node N1 to the second light emitting element LD2, and the second light emitting element LD2 emits light with a luminance corresponding to the driving current. That is, the second light emitting element LD2 may emit light with the luminance corresponding to the driving current during the emission period EP after the first non-emission period NEP1.

In the second non-emission period NEP2, the emission control signal EM is supplied to the emission control line ELi, and thus the fifth transistor M5 and the sixth transistor M6 are turned off. When the fifth transistor M5 and the sixth transistor M6 are turned off, electrical connection between the first power line PL1 and the second light emitting element LD2 is blocked, and thus the second light emitting element LD2 is set to the non-emission state.

In the second non-emission period NEP2, the scan signals GW, GC, GI, and GB are not supplied. Therefore, the storage capacitor Cst maintains the voltage stored in the first non-emission period NEP1. During the emission period EP following the second non-emission period NEP2, supply of the emission control signal EM is stopped, and thus the fifth transistor M5 and the sixth transistor M6 are turned on. Then, during the emission period EP following the second non-emission period NEP2, the second light emitting element LD2 may emit light with a luminance corresponding to the driving current.

Meanwhile, in an embodiment of the disclosure, a supply waveform of the scan signal for driving the sub-pixels PX1 to PX3 may be variously changed. For example, as shown in FIG. 6B, after the second scan signal GW is supplied to the second scan line SL2i during the first non-emission period NEP1, the first scan signal GB may be supplied to the first scan line SL1i. In addition, the first scan signal GB may be supplied to the first scan line SL1i during the second non-emission period NEP2.

When the first scan signal GB is supplied to the first scan line SL1i during the second non-emission period NEP2, the seventh transistor M7 may be turned on, and thus the anode electrode of the second light emitting element LD2 may be initialized to the voltage of the first initialization power Vint1. When the voltage of the first initialization power Vint1 is supplied to the anode electrode of the second light emitting element LD2 in the second non-emission period NEP2, a luminance increase of the second light emitting element LD2 may be prevented.

Meanwhile, when the first scan signal GB is supplied, the first scan line SL1i may be set to a low level voltage, and when supply of the first scan signal GB is stopped, the first scan line SL1i may be set to a high level voltage. When the first scan signal GB is supplied to the first scan line SL1i (that is, the low level voltage), the voltage of the fourth node N4 of each of the sub-pixels PX1 to PX3 may be set to the voltage of the first initialization power Vint1.

In addition, when supply of the first scan signal GB is stopped (that is, the high level voltage), the fourth node N4 of the second sub-pixel PX2 may maintain the voltage of the first initialization power Vint1 as shown in FIG. 7. On the other hand, when supply of the first scan signal GB is stopped, the voltage of the fourth node N4 of each of the first sub-pixel PX1 and the third sub-pixel PX3 may be set to a voltage (for example, Vint1+α) higher than the voltage of the first initialization power Vint1 by coupling of the boosting capacitor Cb included in each of the first sub-pixel PX1 and the third sub-pixel.

That is, in an embodiment of the disclosure, the first to third sub-pixels PX1 to PX3 may receive the same voltage (that is, Vint1) from the third power line PL3, and the voltage of the fourth node N4 of the first sub-pixel PX1 and the third sub-pixel PX3 may be set to the voltage higher than the voltage of the fourth node N4 of the second sub-pixel PX2 by the boosting capacitor Cb.

In addition, capacitances of the boosting capacitor Cb included in the respective first sub-pixel PX1 and third sub-pixel PX3 may be set to be equal to or different from each other. For example, the capacitance of the boosting capacitor Cb included in each of the first sub-pixel PX1 and the third sub-pixel PX3 may be set in accordance with a characteristic of each of the sub-pixels PX1 and PX3.

Figure 8A:
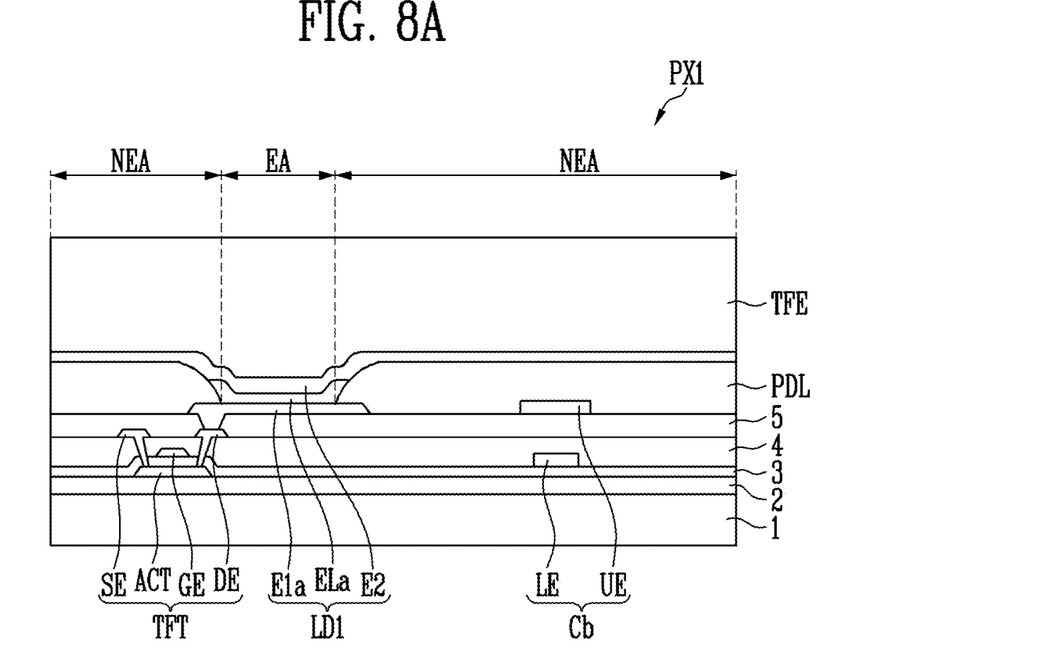
FIG. 8A is a diagram illustrating a schematic cross-sectional view of the first sub-pixel.
Figure 8B:
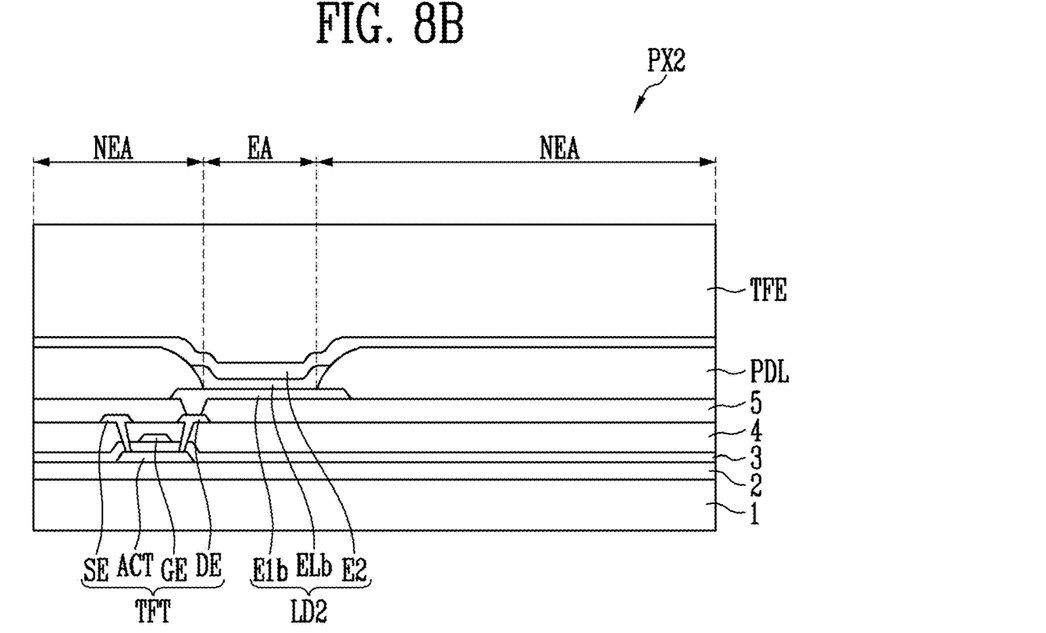
FIG. 8B is a diagram illustrating a schematic cross-sectional view of the second sub-pixel.
Figure 9:
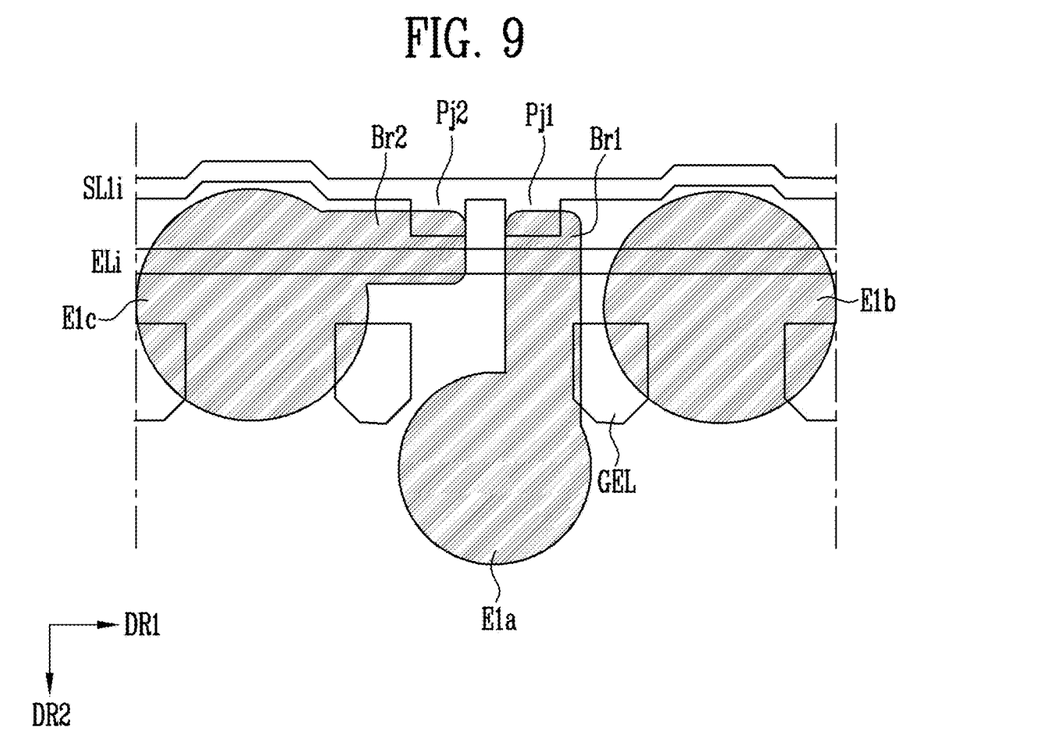
FIG. 9 is a plan view schematically illustrating first to third sub-pixels.

FIG. 8A is a diagram illustrating a schematic cross-sectional view of the first sub-pixel. FIG. 8B is a schematic cross-sectional view of the second sub-pixel. FIG. 9 is a plan view schematically illustrating the first to third sub-pixels.

Since a cross-sectional view of the third sub-pixel PX3 is similar (or identical) to that of the first sub-pixel PX1, a separate description is omitted. In FIG. 9, only first electrodes E1a, E1b, and E1c formed by a pixel electrode layer, and the first scan line SL1i and the emission control line ELi among configurations formed by a gate electrode layer are shown. In FIG. 9, the gate electrode layer GEL positioned spaced apart under the emission control line ELi may be used as a gate electrode of a transistor.

Referring to FIGS. 8A to 9, each of the sub-pixels PX1 and PX2 may include an emission area EA and a peripheral area NEA.

The display device 10 may include a substrate 1, a lower structure including at least one transistor TFT for driving the sub-pixels PX1 and PX2, and a light emitting structure. A touch sensor, a color filter, a window, and the like may be further included on the light emitting structure, but are not shown separately in FIGS. 8A and 8B.

The substrate 1 may be a rigid substrate or a flexible (flexibility) substrate. The rigid substrate may include a glass substrate, a quartz substrate, a glass ceramic substrate, and a crystalline glass substrate. The flexible substrate may include a film substrate and a plastic substrate including a polymer organic material.

A buffer layer 2 may be disposed on the substrate 1. The buffer layer 2 may prevent an impurity from diffusing into the transistor TFT. The buffer layer 2 may be provided as a single layer, but may also be provided as multiple layers of at least two layers.

The lower structure including the transistor TFT and a plurality of conductive lines may be disposed on the buffer layer 2.

In an embodiment, an active pattern ACT may be disposed on the buffer layer 2. The active pattern ACT may be formed of a semiconductor material. For example, the active pattern ACT may include polysilicon, amorphous silicon, oxide semiconductor, or the like. A gate insulating layer 3 may be disposed on the buffer layer 2 on which the active pattern ACT is provided. The gate insulating layer 3 may be an inorganic insulating layer including an inorganic material.

In a case of the first sub-pixel PX1, a gate electrode GE and a lower electrode LE of the boosting capacitor Cb may be disposed on the gate insulating layer 3, and a first insulating layer 4 may be disposed on the gate insulating layer 3 on which the gate electrode GE and the lower electrode LE are provided. A source electrode SE and a drain electrode DE may be disposed on the first insulating layer 4. The source electrode SE and the drain electrode DE may be connected to the active pattern ACT through a contact hole formed in the gate insulating layer 3 and the first insulating layer 4.

In a case of the second sub-pixel PX2, the gate electrode GE may be disposed on the gate insulating layer 3, and the first insulating layer 4 may be disposed on the gate insulating layer 3 on which the gate electrode GE is provided. The source electrode SE and the drain electrode DE may be disposed on the first insulating layer 4. The source electrode SE and the drain electrode DE may be connected to the active pattern ACT through a contact hole formed in the gate insulating layer 3 and the first insulating layer 4. That is, the lower electrode LE of the boosting capacitor Cb is not disposed in the second sub-pixel PX2.

The gate electrode GE and the lower electrode LE may be formed of a conductive material that forms the gate electrode layer. The gate electrode layer may be formed as a single layer or multiple layers formed of molybdenum (Mo), copper (Cu), chromium (Cr), gold (Au), silver (Ag), titanium (Ti), nickel (Ni), neodymium (Nd), indium (In), tin (Sn), and an oxide or an alloy thereof. For example, the gate electrode layer may be formed of multiple layers in which titanium, copper, and/or indium tin oxide are sequentially or repeatedly stacked, but is not limited thereto. The gate electrode GE may overlap one area of the active pattern ACT. The area of the active pattern ACT overlapping the gate electrode GE may be a channel area.

A second insulating layer 5 may be disposed on the first insulating layer 4 on which the source electrode SE and the drain electrode DE are disposed. The second insulating layer 5 may be a planarization layer.

The light emitting elements LD1 and LD2 (or the light emitting structure) may include first electrodes E1a and E1b, light emitting layers ELa and ELb, and a second electrode E2. In addition, the third light emitting element LD3 may also include a first electrode E1c, a light emitting layer, and a second electrode E2.

The first electrodes E1a and E1b configuring the light emitting elements LD1 and LD2 and an upper electrode UE of the boosting capacitor Cb may be disposed on the second insulating layer 5. Here, the upper electrode UE of the boosting capacitor Cb is disposed in the first sub-pixel PX1 (and the third sub-pixel PX3) and does not disposed in the second sub-pixel PX2.

In an embodiment, the first electrodes E1a, E1b, and E1c may be provided as the anode electrode of the light emitting elements LD1, LD2, and LD3. The first electrodes E1a, E1b, and E1c may be formed through the second insulating layer 5 to be connected to the drain electrode DE of the transistor TFT. The first electrodes E1a, E1b, and E1c may be patterned for each of the sub-pixels PX1, PX2, and PX3. The first electrodes E1a, E1b, and E1c may be disposed in a portion of the peripheral area NEA and the emission area EA on the second insulating layer 5.

The first electrodes E1a, E1b, and E1c and the upper electrode UE may be formed of a conductive material forming the pixel electrode layer. The pixel electrode layer may be formed of silver (Ag), magnesium (Mg), aluminum (Al), platinum (Pt), palladium (Pd), gold (Au), nickel (Ni), neodymium (Nd), iridium (Ir), and (Cr), a metal layer of an alloy or the like thereof, indium tin oxide (ITO), indium zinc oxide (IZO), zinc oxide (ZnO), indium tin zinc oxide (ITZO), and/or the like, but is not limited thereto.

The upper electrode UE overlaps the lower electrode LE to form the boosting capacitor Cb. More specifically, as shown in FIG. 9, the first scan line SL1i may be formed by the gate electrode layer. The first scan line SL1i may be disposed to extend in the first direction DR1. A first protrusion Pj1 and a second protrusion Pj2 protruding in a second direction DR2 may be formed from the first scan line SL1i. Here, the first protrusion Pj1 and the second protrusion Pj2 may be adjacently positioned, and each of the first protrusion Pj1 and the second protrusion Pj2 may be the lower electrode LE of the boosting capacitor Cb.

For example, the first protrusion Pj1 may be the lower electrode LE of the boosting capacitor Cb included in the first sub-pixel PX1, and the second protrusion Pj2 may be the lower electrode LE of the boosting capacitor Cb included in the third sub-pixel PX3.

The first sub-pixel PX1 may include a first branch Br1 branched from the first electrode E1a (or branched from the pixel electrode layer of the first sub-pixel PX1). The first branch Br1 may at least partially overlap the first protrusion Pj1. The first branch Br1 may be the upper electrode UE of the boosting capacitor Cb. The first branch Br1 may extend in the second direction DR2. Alternatively, the first branch Br1 may extend to at least partially overlap the first protrusion Pj1.

The third sub-pixel PX3 may include a second branch Br2 branched from the first electrode E1c (or branched from the pixel electrode layer of the third sub-pixel PX3). The second branch Br2 may at least partially overlap the second protrusion Pj2. The second branch Br2 may be the upper electrode UE of the boosting capacitor Cb. The second branch Br2 may extend in the first direction DR1. Alternatively, the second branch Br2 may extend to at least partially overlap the second protrusion Pj2.

A pixel defining layer PDL may be disposed in the peripheral area NEA on the second insulating layer 5 and may expose a portion of the first electrodes E1a, E1b, and E1c. The pixel defining layer PDL may be formed of an organic material and/or an inorganic material. That is, the emission area EA may be defined by the pixel defining layer PDL.

The light emitting layers ELa and ELb may be disposed on the first electrodes E1a and E1b exposed by the pixel defining layer PDL. The light emitting layers ELa and ELb may be disposed to extend along a sidewall of the pixel defining layer PDL. In an embodiment, the light emitting layer ELa included in the first sub-pixel PX1 may be formed using at least one light emitting material capable of emitting green light. In an embodiment, the light emitting layer ELb included in the second sub-pixel PX2 may be formed using at least one light emitting material capable of emitting red light. In an embodiment, the light emitting layer (not shown) included in the third sub-pixel PX3 may be formed using at least one light emitting material capable of emitting blue light.

The second electrode E2 may be commonly disposed on the pixel defining layer PDL and the light emitting layers ELa and ELb. In an embodiment, the second electrode E2 may be provided as the cathode electrode of the light emitting elements LD1, LD2, and LD3. The second electrode E2 may be formed using metal, an alloy, metal nitride, conductive metal oxide, a transparent conductive material, or the like. These may be used alone or in combination with each other.

An encapsulation layer TFE covering the second electrode E2 may be formed on the second electrode E2. The encapsulation layer TFE may include a plurality of insulating layers covering the light emitting element LD. For example, the encapsulation layer TFE may have a structure in which an inorganic layer and an organic layer are alternately stacked. In addition, according to a case, the encapsulation layer TFE may be an encapsulation substrate disposed on the light emitting element LD and attached to the substrate 1 through a sealant.

Although the above has been described with reference to the embodiments of the disclosure, those skilled in the art will understand that the disclosure may be variously corrected and modified within the scope without departing from the spirit and scope of the disclosure described in the claims.

What is claimed is:

1. A pixel comprising:
a first transistor connected between a first power line and a second power line, and having a gate electrode connected to a first node;
a light emitting element connected between the first power line and the second power line;
an initialization transistor connected between a third power line and an anode electrode of the light emitting element, and having a gate electrode connected to a first scan line; and
a boosting capacitor connected between the first scan line and the anode electrode of the light emitting element,
wherein the first transistor further includes a second gate electrode electrically connected to the first power line.

2. The pixel according to claim 1, further comprising:
a second transistor connected between a data line and a second node to which a first electrode of the first transistor is connected, and having a gate electrode connected to a second scan line;
a third transistor connected between the first node and a third node to which a second electrode of the first transistor is connected, and having a gate electrode connected to a third scan line;
a fourth transistor connected between the first node and a fourth power line and having a gate electrode connected to a fourth scan line;
a fifth transistor connected between the first power line and the second node and having a gate electrode connected to an emission control line;
a sixth transistor connected between the third node and the anode electrode of the light emitting element, and having a gate electrode connected to the emission control line; and
a storage capacitor connected between the first power line and the first node.

3. The pixel according to claim 2, wherein the third transistor and the fourth transistor are N-type transistors, and the first transistor, the second transistor, the fifth transistor, the sixth transistor, and the initialization transistor are P-type transistors.

4. A display device comprising:
a first sub-pixel including a first initialization transistor supplying a voltage of initialization power to an anode electrode of a first light emitting element when a first scan signal is supplied to the first scan line, and a first boosting capacitor connected between the first scan line and the anode electrode of the first light emitting element; and
a second sub-pixel including a second initialization transistor supplying a voltage of the initialization power to an anode electrode of a second light emitting element when the first scan signal is supplied to the first scan line.

5. The display device according to claim 4, wherein the second sub-pixel does not include a boosting capacitor connected between the first scan line and the anode electrode of the second light emitting element.

6. The display device according to claim 4, wherein the second light emitting element emits red light, and the first light emitting element emits a color other than the red light.

7. The display device according to claim 4, further comprising:
a third sub-pixel including a third initialization transistor supplying the voltage of the initialization power to an anode electrode of a third light emitting element when the first scan signal is supplied to the first scan line, and a second boosting capacitor connected between the first scan line and the anode electrode of the third light emitting element.

8. The display device according to claim 7, wherein the first boosting capacitor and the second boosting capacitor have the same capacitance.

9. The display device according to claim 7, wherein the first boosting capacitor and the second boosting capacitor have different capacitances.

10. A display device comprising:
a first sub-pixel including a first pixel electrode layer, a second sub-pixel including a second pixel electrode layer, and a third sub-pixel including a third pixel electrode layer; and
a first scan line extending in a first direction and electrically connected to the first sub-pixel, the second sub-pixel, and the third sub-pixel,
wherein the first pixel electrode layer and the third pixel electrode layer overlaps at least a portion of the first scan line, and the second pixel electrode layer does not overlap the first scan line.

11. The display device according to claim 10, wherein the first scan line includes a first protrusion protruding in a second direction different from the first direction and at least partially overlapping the first pixel electrode layer, and a second protrusion protruding in the second direction and at least partially overlapping the third pixel electrode layer.

12. The display device according to claim 11, further comprising:
a first branch branched from the first pixel electrode layer and at least partially overlapping the first protrusion.

13. The display device according to claim 11, further comprising:
a second branch branched from the third pixel electrode layer and at least partially overlapping the second protrusion.

14. The display device according to claim 10, wherein the first sub-pixel is a green sub-pixel, the second sub-pixel is a red sub-pixel, and the third sub-pixel is a blue sub-pixel.

15. The display device according to claim 10, wherein a pixel electrode layer which includes the first pixel electrode layer, the second pixel electrode layer, and the third pixel electrode layer, and the first scan line are positioned in different layers.

16. The display device according to claim 15, wherein the pixel electrode layer is positioned above the first scan line in a cross-sectional view.

* * * * *